(12) United States Patent
Mileski

(10) Patent No.: US 7,804,454 B1
(45) Date of Patent: Sep. 28, 2010

(54) ACTIVE HIGH FREQUENCY TRANSMITTER ANTENNA ASSEMBLY

(75) Inventor: Paul M. Mileski, Mystic, CT (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 429 days.

(21) Appl. No.: 12/148,075

(22) Filed: Apr. 9, 2008

Related U.S. Application Data

(60) Provisional application No. 60/923,617, filed on Apr. 13, 2007.

(51) Int. Cl.
H01Q 1/00 (2006.01)
(52) U.S. Cl. .................................. 343/722; 343/850
(58) Field of Classification Search ................. 343/722, 343/749, 850
See application file for complete search history.

(56) References Cited

U.S. PATENT DOCUMENTS 6,784,744 B2 * 8/2004 Tichauer ..................... 330/285

* cited by examiner

Primary Examiner—Hoang V Nguyen
(74) Attorney, Agent, or Firm—James M. Kasischke; Michael P. Stanley; Jean-Paul A. Nasser

(57) ABSTRACT

A combined antenna transmitter joined for transmitting a message signal includes a switching signal source modulated by the message signal. The switching signal is provided to a transistor at an operating frequency. The transistor switches a high voltage input through the transistor, a choke inductor and a boost inductor. A bypass capacitor is provided between the inductors for shielding the high voltage input. An antenna is connected between the boost inductor and the transistor for transmitting a radio frequency signal at the operating frequency. There is thus provided a compact, efficient transmitter and antenna assembly for transmitting modulated message signals.

15 Claims, 2 Drawing Sheets

ACTIVE HIGH FREQUENCY TRANSMITTER ANTENNA ASSEMBLY

CROSS REFERENCE TO RELATED APPLICATION

This application claims the benefit of and priority to U.S. provisional patent application No. 60/923,617, filed 13 Apr. 2007, which is owned by the assignee of the instant application and the disclosure of which is incorporated herein by reference in its entirety.

STATEMENT OF GOVERNMENT INTEREST

The invention described herein may be manufactured and used by or for the Government of the United States of America for governmental purposes without the payment of any royalty thereon or therefore.

BACKGROUND OF THE INVENTION (1) Field of the Invention

The invention relates to antennas and is directed more particularly to a design for compact high frequency transmitting antenna capable of over the horizon communication.

(2) Description of the Prior Art

Beyond line of sight or over the horizon communication is possible using the satellite, the aircraft relay, ionospheric (sky-wave) propagation and ground-wave propagation (i.e. AM broadcast stations). Applications for which the use of a satellite or airborne relay is not feasible (due to availability or cost) are left only with either ground-wave or ionospheric HF-band propagation. Ionospheric propagation occurs most effectively at frequencies between 2 MHz and 30 MHz, known as the HF or shortwave band. The use of either of these HF-band propagation modes is not new and actually dates back to the beginning of radio.

Antennas, regardless of frequency, generally must be electrically large (at least ¼ wavelength at the operating frequency) in order to be effective radiators. At the HF-band frequencies, particularly those between 2 and 30 MHz, the wavelengths involved (150 meters and 10 meters, respectively) require using antennas that are physically too large for small systems such as a personal radio or a compact (<0.5 cubic foot) at-sea buoy. Although matching networks can be used, these have a number of drawbacks including poor frequency flexibility, narrow bandwidth, poor efficiency, and a tendency to suffer environmental performance degradation or "detuning". Environmental performance degradation is caused by insufficient height above a conducting surface and surrounding objects.

Radio systems incorporating such match networked antennas can still be effective, if sufficient transmitter power is available to overcome the antenna inefficiency, the frequency of operation is fixed and the location is held constant. These parameters cannot exist in many applications such as for a buoy that is small, has low battery capacity, needs frequency flexibility, and is located in a highly variable environment.

The main reason that these drawbacks exist for electrically small antennas is that traditional radio transmitting systems utilize a radio frequency power source or transmitter that is designed to operate with a load close to 50 ohms. This load is a world-wide industry standard for interconnection of radio equipment. Unfortunately, an electrically small antenna typically presents a much higher load (perhaps by a factor of 100, based upon size) than 50 ohms. This load is typically connected to a radio through a standard 50-ohm coaxial transmission line. The antenna must be provided with a matching network to transform its natural load impedance (perhaps 2000 ohms in magnitude, mostly capacitive reactance) to 50 ohms. Without use of a matching network, enormous losses are encountered within the transmission line. Such a matching network requires space and its performance suffers with changes in environment. Efficient matching networks are much less adaptable than networks having significant losses. Losses are often deliberately included within many matching networks for improving unattended performance.

Ultra-wide band radio technology is vastly different from classical radio transmission. Extremely short pulses are generated at the baseband frequency and are transmitted without the use of a carrier. Ultra-wide band uses extremely short pulses of electromagnetic energy that translate to very wide bandwidths in the frequency domain. In the past ultra-wide band was referred to as baseband, carrier-free and impulse technology. The FCC defines ultra-wide band as a signal with either a fractional bandwidth of 20% of the center frequency or 500 MHz. Due to the low duty cycle of the pulse the energy requirements are significantly reduced. Due to the low power spectral density the system has a low probability of intercept and low probability of detection. The wide bandwidth and low power makes ultra-wide band transmissions appear as background noise. The power spectral density (PSD) is defined as:

$$PSD = \frac{B}{P} \qquad (1)$$

Where P is the power transmitted in watts (W), B is the bandwidth of the signal in hertz (Hz), and the unit of PSD is watts/hertz (W/Hz).

The key benefits for ultra-wide band are high data rates, low equipment cost, low power requirements, multipath immunity and ranging. The large bandwidths of ultra-wide band means extremely high data rates can be achieved. Because ultra-wide band pulses are extremely short they can be distinguished from multipath because of the fine time resolution. ultra-wide band low frequency components enable the signals to propagate effectively through materials such as foliage and structures. ultra-wide band transmitters and receivers do not require components such as modulators, demodulators and IF stages. This reduces cost, size, weight and power consumption of ultra-wide band systems compared with conventional narrow-band communication systems. The low power and inexpensive components make ultra-wide band of interest for distributed sensor network systems. Since the sensors themselves require power, typically the power for the communications is only a small portion of the overall system power requirements. In addition, because of the great numbers of sensors in a sensor field and the fact that they may be expendable, system cost is a great concern. It is expected that sensor systems may not have high data rate requirements as the messages will be short. However, higher data rates allows for quicker message offload and could allow for future growth.

Impulse generation is the fundamental approach for generating ultra-wide band waveforms. Looking back in history, ultra-wide band actually had its origins in the spark gap transmission design of Marconi and Hertz in the late 1890s. The pulse characteristic (Gaussian, Gaussian monocycle, polycycle in a Gaussian envelope, Scholtz Monocycle, square pulse, etc.) can be varied to optimize the frequency spectral mask. FIG. 1 shows a diagram of an ultra-wide band waveform. The frequency bandwidth is on the order of the inverse of the pulse duration (τ)

$$\frac{1}{\tau} = BW \qquad (2)$$

The pulse can be modified by a higher speed chipping signal. This pulse rate determines the center frequency. The frequency is the inverse of the time period (T). The pulse repetition rate, R, causes spectral lines that could cause severe interference to existing narrowband radios. The data rate is directly related to the pulse repetition rate. The pulse shape determines the characteristics of how the energy occupies the frequency domain. For example, Gaussian waves provides a smoother spectral mask. However, a square pulse can easily be generated by switching a transistor on and off quickly. The most common modulation schemes for ultra-wide band systems are pulse amplitude modulation (PAM), on-off keying (OOK), Binary Phase Shift Keying (BPSK) and pulse position modulation (PPM).

There is a need for a compact antenna that can be placed on a buoy. This type of emplacement requires high efficiency because of the power limitations of the isolated buoy. Providing the greatest radio frequency voltage at the feed-point of the antenna and maintaining this voltage at as high a level as possible over as wide a range of frequencies and sea conditions as possible is also desirable. The transmitter should also have durable parts giving the greatest voltage at the lowest battery power consumption. Little work has been done in optimizing an HF-band (2-30 MHz) antenna and transmitter system for a small, expendable device or platform.

SUMMARY OF THE INVENTION

The object of the present invention is, therefore, to provide a compact high efficiency transmitter and antenna.

With the above and other objects in view, a combined antenna transmitter joined for transmitting a message signal includes a switching signal source modulated by the message signal. The switching signal is provided to a transistor at an operating frequency. The transistor switches a high voltage input through the transistor, a choke inductor and a boost inductor. A bypass capacitor is provided between the inductors for shielding the high voltage input. An antenna is connected between the boost inductor and the transistor for transmitting a radio frequency signal at the operating frequency. There is thus provided a compact, efficient transmitter and antenna assembly for transmitting modulated message signals.

The above and other features of the invention, including various novel details of construction and combinations of parts, will now be more particularly described with reference to the accompanying drawings and pointed out in the claims. It will be understood that the particular assembly embodying the invention is shown by way of illustration only and not as a limitation of the invention. The principles and features of this invention may be employed in various and numerous embodiments without departing from the scope of the invention.

BRIEF DESCRIPTION OF THE DRAWINGS

Reference is made to the accompanying drawings in which is shown an illustrative embodiment of the invention, from which its novel features and advantages will be apparent, wherein corresponding reference characters indicate corresponding parts throughout the several views of the drawings and wherein.

DESCRIPTION OF THE PREFERRED EMBODIMENTS

Figure 1:
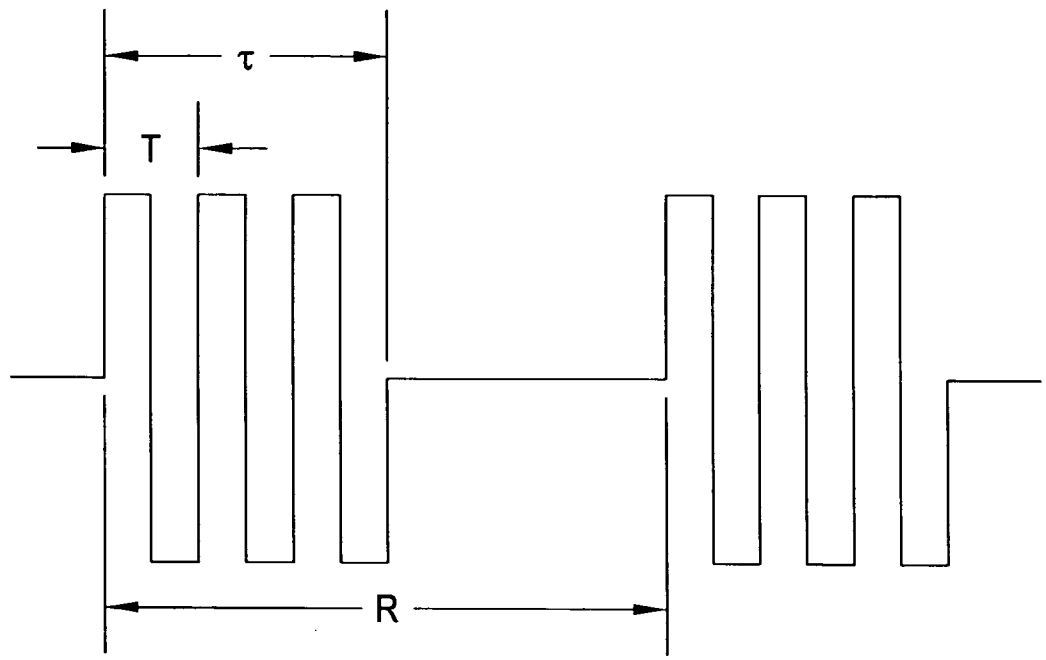
FIG. 1 shows a diagram of an ultra-wide band waveform.
Figure 2:
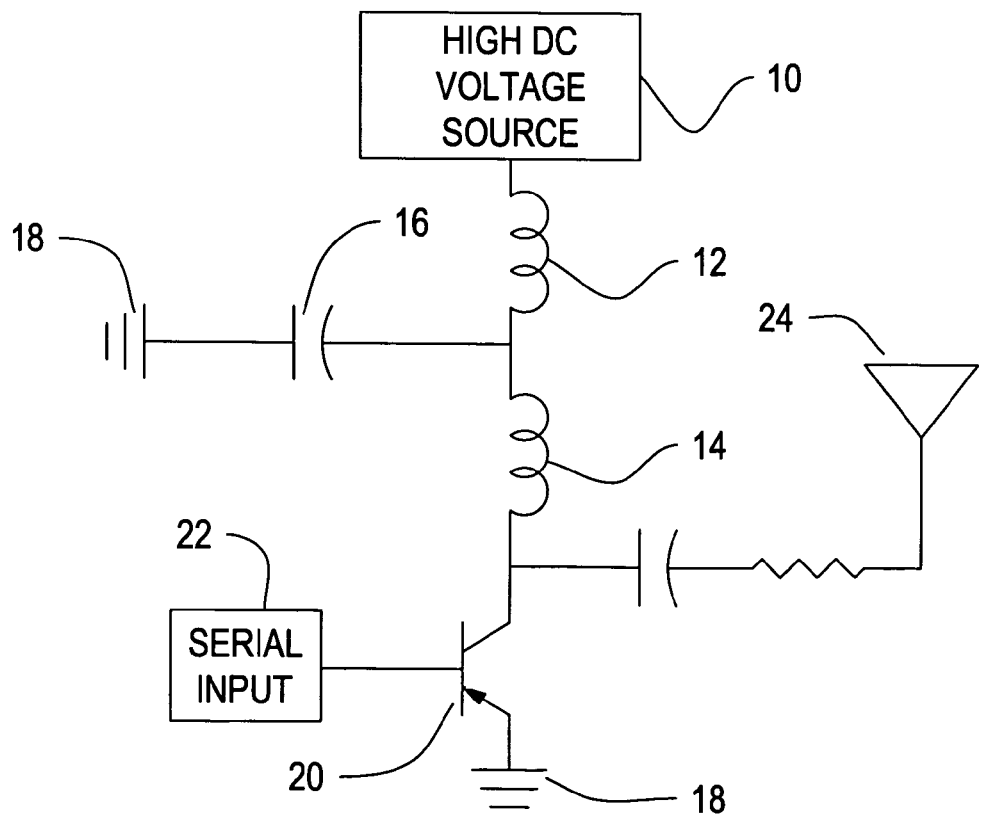
FIG. 2 shows a diagram of a circuit implementing one embodiment of the current invention.

This invention utilizes a solid-state circuit to provide a high voltage radio frequency signal directly to the feed-point of a small antenna. FIG. 1 provides a generalized embodiment of the invention, a high voltage source 10 is joined to a radio frequency choke inductor 12. High voltage source can be any voltage with the level of the voltage being dictated by the desired antenna voltage and the handling capacity of transistor 20. A boost inductor 14 is joined to the choke inductor 12. A bypass capacitor 16 is joined between boost inductor 14 and choke inductor 12 and ground 18. Boost inductor 14 is further joined to the collector of transistor 20. Emitter of transistor 20 is joined to ground 18. Transistor 20 base is joined to a switching signal source 22. An is antenna 24 is joined between boost inductor 14 and transistor 20 drain. Antenna 24 is modeled as a capacitor and resistor in series. Details of a more exact embodiment will be provided in the following text.

In operation, signal source 22 provides the digital serial signal to transistor 20. Transistor 20 acts as a radio frequency switch. When digital serial signal is on, transistor 20 gate is on, this causes current to flow from high voltage source 10 through choke inductor 12, through boost inductor 14 and through transistor 20 from drain to source. Current through choke inductor 12 and boost inductor 14 cause magnetic field storage in the inductors 12 and 14. When digital serial signal is off, transistor gate is off. The magnetic field in the inductors 12 and 14 is transformed into voltage at antenna 24. The change in magnetic field is determined by the value of boost inductor 14 inductance, the capacitance value of transistor 20, and the resistance and capacitance of antenna 24. The voltage provided at antenna 24 is the feed voltage of the antenna. The choke inductor 12 and bypass capacitor 16 provide filtering that minimizes the peak current presented to high voltage source 10.

Figure 3:
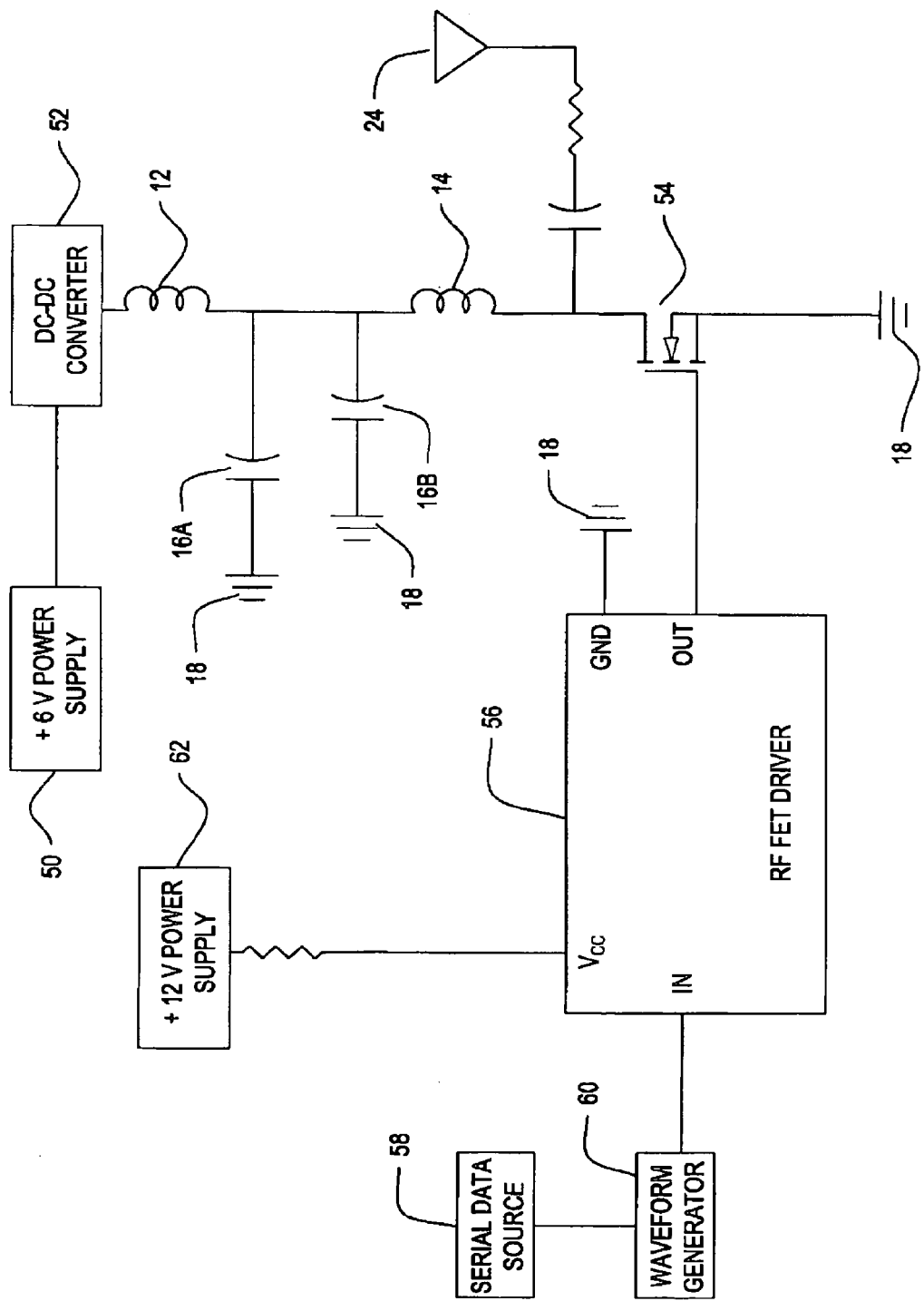
FIG. 3 shows a diagram of a circuit implementing another embodiment of the current invention.

A practical embodiment of the invention is shown in FIG. 3. High voltage source 10 is made from 6 volt power supply 50 joined to a DC-DC converter 52. 6 volt power supply 50 is made from a battery pack of 5 standard AA sized batteries joined to give approximately a 6 volt output. DC-DC converter 52 is any DC-DC converter 52 capable of converting the input 6 volt from power supply 50 to a 350 Volt output voltage at converter 52 output. This can be any DC-DC converter such as an EMCO model F04 or the like. DC-DC converter output is joined to choke inductor 12 having an inductance value of 200 µH. Boost inductor 14 has an inductance value of 1.1 µH. Two capacitors in parallel are used as bypass capacitor 16 having values of 0.01 µF at 400 Volts and 2 µF at 300 Volts. Transistor 20 is embodied as a high voltage field effect transistor (FET) 54 such as model DE-150-102N02A manufactured by IXYS-RF or the like. This transistor 54 should have the following characteristics:

$V_{DSS}$=1000V $I_{DSS}$=2 A $R_{DS(on)}$=7.8 ohm $P_{DC}$=200 W
$C_{in}$=500 pF
$C_{DS}$=150 pF Transistor 54 gate is switched by an output from an FET Driver 56. FET Driver 56 translates an input transistor-transistor-logic (TTL) signal into a 15 V peak FET control signal. FET Driver 56 also isolates the signal from the transmitter circuitry. (TTL signals are normally 0-5 Volts and have characteristics making them unsuitable for use as FET driving sources.) FET Driver is embodied as an IXYS DEIC420 or the like. Data from a data source 58 is provided serially to a waveform generator 60. (This can also be performed by gating a 21.5 MHz serial TTL signal.) Output of waveform generator 58 is provided to the input of FET Driver 56. FET Driver 56 is powered by a 12 V DC Power source which is embodied as a 6 V battery pack 58 in series with 6 Volt power supply 50.

Antenna 24 used various sizes of vertical whip antennas ranging in size from 1 foot to six feet. The actual size of the antenna depends on the operating constraints of the application.

The transmitting electronic design includes the electrically short antenna 24 as part of the electronic circuit and thus provides a high voltage directly to the antenna feed instead of utilizing a 50-ohm transmitter and a matching network. This approach effectively enables an "active match" between the antenna and the radio providing the basic radio frequency communication signal. The impedance of the electrically small antenna 24, along with the effect upon its impedance due to changing proximity to a conducting surface (such as seawater), thus has little effect upon circuit performance since its principal component (capacitance) is "swamped" by the drain to source capacitance (typically 150 pF) presented by transistor 54. The result is that the voltage provided to the small vertical antenna is highly stable over a wide antenna attitude range—a great advantage when operating in large seas or, for any general case when the antenna location relative to a conducting surface cannot be controlled. The direct connection between the antenna 24 and the transmit electronics enables the greatest electrical conversion efficiency between the DC (battery) source and the RF voltage provided to the antenna since no intermediate devices (such as lossy matching networks) are included. The lack of a large number of tuning components increases the frequency range over which this system can efficiently operate. A passive matching network of similar frequency response would require intentional losses (i.e., resistors) to achieve similar bandwidth and thus incur loss much greater than that encountered here.

This transmitter antenna circuit has a fairly broad band even though maximum voltage occurs at a single frequency dictated by the resistance, inductance and capacitance values of the system. The signal used for the transmit waveform was chosen (based upon overall system goals) to be a fairly low duty cycle radio frequency pulse occurring, in this case, at 21.4 MHz. However, the frequency of operation is not critical and the circuit shown operated satisfactorily over approximately a 5 MHz band centered at 21.5 MHz.

It should be noted that significant signal to noise ratio increase can be achieved by decreasing the bandwidth of the overall system. The tested system used a transmit pulse width that resulted in a 0.2% (approximate) duty cycle. Increasing the transmit pulse width by a factor of 10 by should increase the received signal to noise ratio by 10 dB at the same data rate albeit with a corresponding increase in power consumption. The invention can be used with a wide variety of duty cycles, including those associated with traditional narrow-band systems. The circuit components shown are chosen to benefit the ultra-wide-band application. One embodiment of this invention could employ pulse position modulation (PPM). With PPM a slightly retarded pulse could represent a "0" and a slightly advanced pulse represents a "1". Other modulations are available for use in this type of transmitter and antenna. These include pulse amplitude modulation (PAM), on-off keying (OOK), Binary Phase Shift Keying (BPSK) and the like.

One embodiment for application in a buoy utilizes ground wave propagation. Ground wave propagation is a phenomenon that occurs when the electromagnetic wave is guided by the Earth's surface. Ground wave is a low frequency phenomenon which occurs primarily at HF-band frequencies (3-30 MHz). Signal losses from ground wave transmission are considerably less than those encountered with direct wave transmission in which multipath cancellation from ground reflected signal essentially cancels the direct path. Commercial ultra-wide band such as that used in wireless personal area networks (WPAN) in this application would encounter significant multipath cancellation from the sea surface and be limited in range to 4 miles by the radio horizon. Ground wave propagation however does not encounter multipath cancellation and reaches beyond line-of-sight. Ground wave propagation is also advantageous because the increased surface conductivity of the seawater path lowers signal losses.

This invention can be used for any application where the low-power, small size, low-cost and wide operating frequency range are considered highly suitable including bandwidths both wider and more narrow than that utilized in the embodiment given here. Applications include hand-held devices (such as a walky-talky), small marine vehicles and mobile applications.

It will be understood that many additional changes in the details, materials, and arrangement of parts, which have been herein described and illustrated in order to explain the nature of the invention, may be made by those skilled in the art within the principles and scope of the invention as expressed in the appended claims.

What is claimed is:

1. A combined antenna transmitter joined for transmitting a digital signal comprising:
    a switching signal source modulated by the digital signal, said switching signal source providing a switching signal at an operating frequency;
    a transistor having a gate input joined to said switching signal source for switching said gate input, said transistor further having a drain and a source;
    a boost inductor having a first contact joined to said transistor drain and a second contact;
    a choke inductor having a first contact joined to said boost inductor second contact and a second contact;
    a direct current voltage source having a positive terminal joined to said choke inductor second contact and a ground terminal joined to said transistor source;
    an antenna joined between said transistor drain and said boost inductor first contact; and
    a capacitor having a first contact joined between said boost inductor second contact and said choke inductor first contact and a second contact joined to said direct current voltage source ground terminal.

2. The device of claim 1 wherein said switching signal source is a waveform generator.

3. The device of claim 2 wherein the digital signal is modulated in the waveform generator by one means selected from the list including pulse amplitude modulation, on-off keying, binary phase shift keying and pulse position modulation.

4. The device of claim 3 wherein the digital signal is modulated in the waveform generator by pulse position modulation.

5. The device of claim 1 wherein said transistor is capable of switching more than 200 volts.

6. The device of claim 5 wherein said transistor is a high voltage field effect transistor.

7. The device of claim 5 wherein said transistor is a bipolar junction transistor.

8. The device of claim 1 wherein said direct current voltage source comprises:
- a battery having a ground terminal and a positive terminal; and
- a DC-DC voltage converter joined to said battery positive terminal and having a voltage source positive terminal.

9. The device of claim 1 wherein said antenna is a whip antenna having length less than one quarter wavelength of the operating frequency.

10. The device of claim 9 wherein said antenna has length less than eight feet.

11. The device of claim 1 wherein the operating frequency is between 2 and 30 MHz.

12. The device of claim 1 wherein the operating frequency and modulation are selected to provide ultra-wide band operation.

13. The device of claim 12 wherein the message signal is modulated by said switching signal source by one means selected from the list including pulse amplitude modulation, on-off keying, binary phase shift keying and pulse position modulation.

14. The device of claim 12 wherein said antenna propagates radio waves in the ground wave mode of propagation.

15. A transmitter antenna assembly comprising:
- a sensor providing a digitized signal;
- a switching signal source modulated by the digitized signal, said switching signal source providing a switching signal at an operating frequency;
- a transistor having a gate input joined to said switching signal source for switching said gate input, said transistor further having a drain and a source;
- a boost inductor having a first contact joined to said transistor drain and a second contact;
- a choke inductor having a first contact joined to said boost inductor second contact and a second contact;
- a direct current voltage source having a positive terminal joined to said choke inductor second contact and a ground terminal joined to said transistor source;
- an antenna joined between said transistor drain and said boost inductor first contact wherein said antenna is provided less than twelve feet from the surface of a surrounding conductive medium; and
- a capacitor having a first contact joined between said boost inductor second contact and said choke inductor first contact and a second contact joined to said direct current voltage source ground terminal.

\* \* \* \* \*